(12) United States Patent
Feng et al.

(10) Patent No.: US 8,595,606 B1
(45) Date of Patent: Nov. 26, 2013

(54) EXTENDED ROW DIAGONAL PARITY WITH OPTIMAL DECODING PROCEDURE

(75) Inventors: Jun Feng, Vestal, NY (US); Yu Chen, Vestal, NY (US)

(73) Assignee: The Research Foundation of State University of New York, Binghamton, NY (US)

( * ) Notice: Subject to any disclaimer, the term of this patent is extended or adjusted under 35 U.S.C. 154(b) by 329 days.

(21) Appl. No.: 13/182,665

(22) Filed: Jul. 14, 2011

Related U.S. Application Data (60) Provisional application No. 61/365,075, filed on Jul. 16, 2010.

(51) Int. Cl.
*G06F 11/00* (2006.01)
*H03M 13/00* (2006.01)

(52) U.S. Cl.
USPC .................................................... 714/800

(58) Field of Classification Search
None
See application file for complete search history.

(56) References Cited

U.S. PATENT DOCUMENTS

| | | | |
|---|---|---|---|
| 5,579,475 A * | 11/1996 | Blaum et al. | 714/6.32 |
| 6,138,125 A * | 10/2000 | DeMoss | 707/999.202 |
| 7,321,905 B2 * | 1/2008 | Hartline et al. | 1/1 |
| 8,458,515 B1 * | 6/2013 | Saeed | 714/6.22 |
| 8,473,833 B2 * | 6/2013 | Melliar-Smith et al. | 714/801 |
| 2006/0074954 A1 * | 4/2006 | Hartline et al. | 707/101 |
| 2012/0246546 A1 * | 9/2012 | Melliar-Smith et al. | 714/776 |

* cited by examiner

*Primary Examiner* — Guerrier Merant
(74) *Attorney, Agent, or Firm* — Steven M. Hoffberg; Ostrolenk Faber LLP (57) ABSTRACT

A method of recovering two data columns in a row diagonal parity redundant array comprising at least four data columns and two parity columns, comprising: (1) calculating as an accelerator row, a missing chain parity based on available data columns and the two parity columns; (2) defining a recoverable data cell in each of the two columns to be recovered; and (3) iteratively calculating a value for each recoverable data cell based on the available columns, parity information, previously recovered data cells, and the accelerator row and storing the calculated value in the data matrix.

18 Claims, 9 Drawing Sheets

| $d_{0,0}$ | $d_{0,1}$ | $d_{0,2}$ | $d_{0,3}$ | $d_{0,4}$ | $c_{0,0}$ | $c_{0,1}$ |
| --- | --- | --- | --- | --- | --- | --- |
| $d_{1,0}$ | $d_{1,1}$ | $d_{1,2}$ | $d_{1,3}$ | $d_{1,4}$ | $c_{1,1}$ | $c_{1,1}$ |
| $d_{2,0}$ | $d_{2,1}$ | $d_{2,2}$ | $d_{2,3}$ | $d_{2,4}$ | $c_{2,0}$ | $c_{2,1}$ |
| $d_{3,0}$ | $d_{3,1}$ | $d_{3,2}$ | $d_{3,3}$ | $d_{3,4}$ | $c_{3,0}$ | $c_{3,1}$ |
| $d_{4,0}$ | $d_{4,1}$ | $d_{4,2}$ | $d_{4,3}$ | $d_{4,4}$ | $c_{4,0}$ | $c_{4,1}$ |

(a) RDP matrix structure (n=5).

(b) Row parity.

(c) Diagonal parity.

PRIOR ART

EXTENDED ROW DIAGONAL PARITY WITH OPTIMAL DECODING PROCEDURE

CROSS REFERENCE TO RELATED APPLICATION

The present application claims benefit of priority from U.S. Provisional Patent Application Ser. No. 61/365,075, filed Jul. 16, 2010, the entirety of which is expressly incorporated herein by reference.

FIELD OF THE INVENTION

The present invention relates to the field of systems, methods and algorithms for recovery of information based on parity data.

BACKGROUND OF THE INVENTION

In modern storage systems, RAID (Redundant Array of Independent Disks) techniques are known as the preferable technique to achieve high performance and reliability. Among the well known RAID techniques, RAID-6, which can tolerate two failure-disks, has the best balance between storage efficiency and reliability. Erasure-coding technologies can provide both high fault tolerance and high storage efficiency.

While all the erasure coding techniques are feasible in practice, coding schemes based on the Reed-Solomon (RS) code are most popular with their MDS (Maximum Distance Separable) property. The information dispersal algorithm [9] or the Parchive adopted in some schemes or systems [6] indeed are derived from the RS codes. To date, several classes of horizontal MDS array codes have been successfully designed to simultaneously recover double storage node failure including the EVENODD code [1], [2] X code [11], RDP (Row-Diagonal Parity) scheme [3], Libertine Code [7] or their derivative schemes [5], [10]. Although X-code [11] is an elegant two-erasure code, it is not a RAID code since it is a vertical code and does not fit the RAID-6 specification of having coding devices P and Q, where P is a simple parity device [7]. Actually, all non-MDS codes and vertical codes are not implementable in RAID-6 systems [7]. A recent examination of the performance of the codes for RAID-6 using Classic Reed-Solomon codes and Cauchy Reed-Solomon codes based on Open-Source Erasure Coding Libraries concluded that special-purpose RAID-6 codes vastly outperform their general-purpose counterparts and RDP performs the best of these by a narrow margin [8].

See, U.S. Pat. No. 7,577,866, expressly incorporated herein by reference.

Redundant array of independent disks (RAID) is a technology that provides increased storage reliability through redundancy. In RAID, data is replicated across multiple hard drives in a redundant manner so as to facilitate error correction and data recovery in the event of failure of one of the hard drives. See Wikipedia: RAID, en.wikipedia.org/wiki/RAID, last accessed Jun. 29, 2010.

See U.S. Pat. Nos. 7,747,819, 7,743,308, 7,734,868, 7,734,865, 7,725,765, 7,721,146, 7,721,143, 7,716,421, 7,711,793, 7,702,948, 7,702,877, 7,698,592, 7,694,072, 7,685,499, 7,685,462, 7,681,111, 7,681,072, 7,673,167, 7,669,007, 7,664,915, 7,661,058, 7,660,966, 7,657,823, 7,657,705, 7,653,781, 7,650,463, 7,644,304, 7,640,452, 7,634,686, 7,634,618, 7,634,617, 7,631,219, 7,631,218, 7,624,206, 7,617,361, 7,610,446, 7,603,529, 7,601,189, 7,600,151, 7,600,132, 7,594,077, 7,590,780, 7,587,631, 7,587,630, 7,584,325, 7,574,623, 7,574,560, 7,574,542, 7,567,514, 7,565,488, US Pat. App. Nos. 2010/0162088, 20100161898, 2010/0158241, 2010/0153641, 2010/0153640, 2010/0138691, 2010/0138672, 2010/0115331, 2010/0115198, 2010/0106906, 2010/0106904, 2010/0095187, 2010/0095150, 2010/0095060, 2010/0083039, 2010/0079885, 2010/0070705, 2010/0070703, 2010/0064161, 2010/0064103, 2010/0057987, 2010/0050016, 2010/0049914, 2010/0037091, 2010/0037023, 2010/0037022, 2010/0031060, 2010/0030960, 2010/0023814, 2010/0023686, 2010/0011162, 2010/0005482, 2009/0327606, 2009/0327603, 2009/0307426, 2009/0307422, 2009/0307421, 2009/0300282, 2009/0287882, 2009/0287880, 2009/0276566, 2009/0271659, 2009/0249111, 2009/0228650, 2009/0222829, 2009/0210744, 2009/0210742, 2009/0210620, 2009/0210619, and 2009/0204758, the disclosure of each of which is expressly incorporated herein by reference.

A row diagonal parity (RDP) technique reduces overhead of computing diagonal parity for a storage array adapted to enable efficient recovery from the concurrent failure of two storage devices in the array. The diagonal parity is computed along diagonal parity sets that collectively span all data disks and a row parity disk of the array. The parity for all of the diagonal parity sets except one is stored on the diagonal parity disk. The R-D parity technique provides a uniform stripe depth and an optimal amount of parity information. U.S. Pat. No. 7,203,892, the disclosure of which is expressly incorporated herein by reference in its entirety. See also U.S. Pat. No. 7,409,625, U.S. Pat. No. 6,993,701, 2010/0146127, 2008/0227899, 2008/0201457, 2007/0180348, 2006/0142878, 2006/0107135, and 2003/0126523, each of which is expressly incorporated herein by reference.

Definitions of Terms

Assume that there are n symbols in the input symbol (we can call them as n information symbols and denoted as d), and outputs are n+r symbols, where r is the number of redundant/parity symbols that are generated by the erasure codes and denoted as c.

Symbol: the fundamental unit, normally it is a unit of a stored data or a parity. In practice, it could be a disk or a disk sector; it also could be a byte or a bit in one code. However, it does not imply that the symbols are necessarily binary.

Chain: a chain is a set of data symbols and parity symbols that are completely connected, and they are interdependently related according to parity computation relations.

Container: it is a virtual storage medium that contains all symbols belonging to one column of the array, normally it is a disk.

Optimal Erasure Code: it is such type of code that the lost original data symbol can be recovered from any k subset of the n datasets. Optimal Code is also known as Maximum Distance Separable (MDS) Code.

Non-Optimal Erasure Code: the original symbol can only be recovered from n+e subset of the n+r datasets, where e is the extra redundant symbols needed to retrieve from the chain.

Systematic Erasure Code: in this type of coding scheme the first n output code symbols are the original n input information symbols.

Non-Systematic Erasure Code: all the code schemes that are not in the systematic code category.

Update Complexity: this metrics is defined as the average number of parity symbols affected by a change of an individual information symbol in the codes.

Storage Efficiency: it is the ratio of information symbols among the whole symbol set, and normally it is the ratio of k/n.

Regular Structure: the code has regular structure that the coding and decoding procedure can be expressed as a clear equation. The regularity makes it easy to be implemented.

Irregular Structure: there is no clear equation to describe coding or decoding algorithms. However, it is possible to achieve better performances in these procedures.

Array Codes: it is one type of two dimensional codes, in which the parity check equations are given by XOR operations over lines in one or more directions. In fact, all the XOR erasure codes can be viewed as a family of array codes.

Horizontal Code: in this type of code scheme, each symbol of the chain is located in the different containers.

Vertical Code: in contrast to the horizontal code, in vertical code all the information symbols and the redundant symbols that belong to a chain coexist in the same column and are stored in one container.

Out-degree: the number of parity symbols to which an information symbol contributes.

In-degree: the number of information symbols that are involved in computing a parity symbol. Since all erasure codes operate on the ring or finite field, for convenience, we define $<m>n=j$ if and only if $j \equiv m \mod n$ and $0 \le j \le n-1$. For instance, $<7>5=2$ and $<-2>5=3$. For short, we will use $<m>$ in the place of $<m>n$ or m directly when there is no confusion.

Figure 6A:
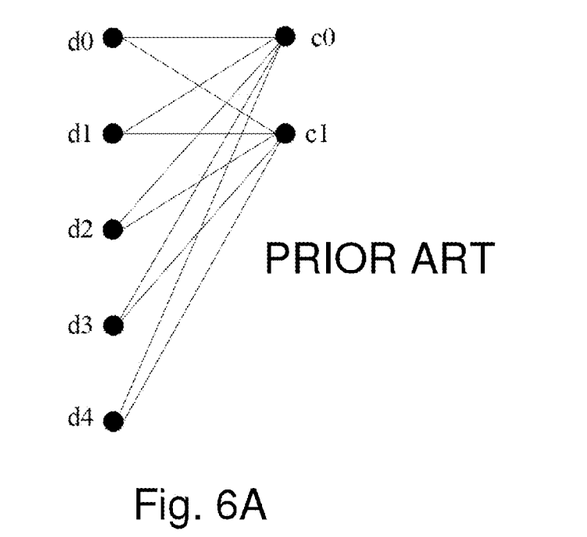
FIG. 6 illustrates a prior art redundant array of independent disks (RAID) system.
Figure 6B:
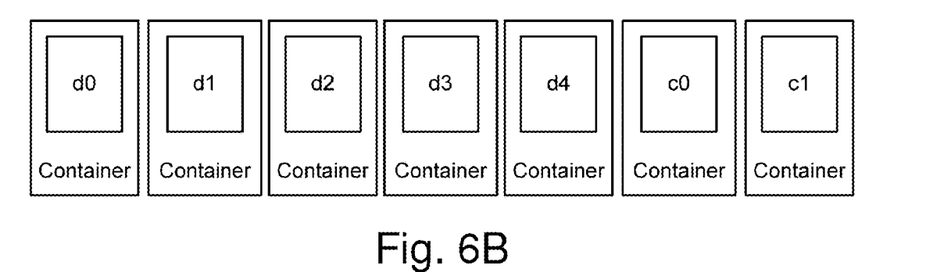
Figure 6C:
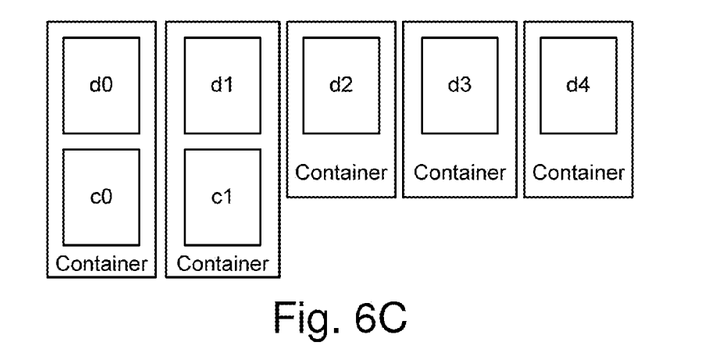

The RDP scheme is schematically exemplified as shown in FIGS. 6A-6C. Assuming n=5, and r=2, the information symbols in the data array are represented as $d_0, d_1, d_2, d_3, d_4$, and the redundant symbols are represented as $c_0$ and $c_1$. There are two chains: $d_0 d_1 d_2 d_3 d_4 d_5 c_0$ and $d_0 d_1 d_2 d_3 d_4 c_1$. If any two symbols are lost, the information symbols can be reconstructed, it is called optimal erasure code or MDS code. Otherwise, it is non-optimal erasure code.

If the beginning five symbols of output codes are $d_0 d_1 d_2 d_3 d_4$, it is a systematic code, otherwise it is a non-systematic code. Since each information symbol contributes to two parity symbols, the update complexity/out-degree is 2. Since each parity symbols is connected to five information symbols, the in-degree is 5. The storage efficiency is 5/7.

If the encoding and decoding method can be described explicitly using an equation, for example, the $c_0$ is the XOR of all information symbols (see FIG. 6A), it is regular structure code; otherwise, it is non-regular. If more parity symbols can be added to tolerate the loss of more information symbols, for example, the r can be 20, or even more, with the n increases; and when any r symbols are lost, the information symbols can be recovered, the code is said to be resilient; otherwise, the code is limited-tolerant. If the output code is placed as FIG. 6B, any disk can have either the parity or the information symbol, it is a horizontal code; otherwise, it is a vertical code as shown by FIG. 6C.

Although there were some other methods developed earlier for distributed fault tolerant symbol storage such as RAID-4 and RAID-5, EVENODD is the milestone that indicated the XOR method has been applied in the symbol storage area. In EVENODD, the information symbols occupy n disks, where n is a prime number. The redundant symbols should be placed on the other two disks. The total disk number is n+2. For the sake of simplicity, we assume that there are only n−1 information symbols stored on the disks. The $i^{th}$ symbol in the $j^{th}$ disk is referred as $a_{ij}$, where $0 \le i \le n-2$, $0 \le j \le n+1$. The redundant symbols are stored in the last two disks. The EVENODD code scheme can be specified as follows: in an (n−1)×(n+2) array, compute the content of the redundant part based on the information symbols such that the information contained in any two erased disks can be reconstructed from the other n disks. The encoding algorithm of the EVENODD code solves the foregoing problem and requires only XOR operations for computing the redundancy.

Before formally describing the encoding procedure, the following assumptions are made. Suppose that there is an imaginary O-row after the last row, i.e., $d_{n-1,j}=0$, $0 \le j \le n-1$. With this assumption, the array is now an n×(n+2) array. Although this assumption is not necessary, it is useful.

Let $$S = \bigoplus_{t=1}^{n-1} d_{n-1-t,t}$$

For each row x, the redundant symbols are obtained according to the follows:

$$c_{t,0} = \bigoplus_{t=0}^{n-1} d_{x,t},$$

and $$c_{t,1} = S \oplus \left( \bigoplus_{t=0}^{n-1} d_{x-t,t} \right)$$

As shown by the equations, two types of redundancy are obtained: horizontal redundancy and diagonal (slope=−1) redundancy. For the first redundant disk, it is simply the XOR of disks $0, 1, \ldots, n-1$. In fact, its contents are exactly the same as the parity contents of the parity disk in an equivalent RAID-5 array with one less disk.

The contents on the other redundant disk come from the diagonal redundancy calculated using the formula for $c_{t,1}$, which shows that the parity is determined by S. When S is 0, the parity is even parity check; when S is 1, the parity is odd parity check. Because of this parity check characteristics, this code scheme is named EVENODD code by the researchers.

The (n−1)×(n+2) array defined above can recover the information symbols lost in any two columns. Therefore, the minimum distance of the code is three. The encoding procedure is very simple and the implementation of the equations for $c_{0,t}$ and $c_{1,t}$ on top of digital circuits is straightforward. In a more general sense, we can implement the equations in the RAID controller using XOR hardware.

In order to decode the parity, we consider the (n−1)×(n+2) array of symbols such that the last two columns are redundant according to the parity encoding algorithm for $c_{0,t}$ and $c_{1,t}$. Assume that columns (disks) i and j are failed, where $0 \le i \le j \le n+1$. Let's consider the following four scenarios:

1. i=n and j=n+1

Both the redundant disks have failed. Disk m can be reconstructed using $c_{0,t}$ and disk (n+1) can be reconstructed using $c_{1,t}$. In fact, the recovery procedure is equivalent to the encoding procedure.

2. i<n and j=n

One redundant disk and one symbol disk have failed. Disk i can be easily recovered as follows:

Let $$S = d_{i-1,n+1} \oplus \left( \bigoplus_{t=0}^{n-1} d_{i-y-1,x} \right)$$

where $a_{n-1,y}=0$, $0 \leq y \leq n+1$, then $$d_{k,i} = S \oplus d_{i-1,n+1} \oplus \left( \bigoplus_{\substack{y=0 \\ y \neq 0}}^{n-1} d_{k+i-y,y} \right),$$

where $0 \leq k \leq n-2$. And $d_{k,n}$, $0 \leq k \leq n-2$ can be obtained by the equation for $d_{k,i}$.

3. $i<n$ and $j=n+1$

One redundant disk and one symbol disk have failed. We can recover disk i using the equation for $c_{0,t}$, and disk n+1 using S and $c_{1,t}$ once disk i has been reconstructed.

4. $i<n$ and $j<n$

If both failed disks carry information and we cannot retrieve them using the parities separately as we did in the previous three cases. The information can be recovered through the following steps.

Assume that the imaginary row $d_{n-1,y}=0$ for $0 \leq y \leq n-1$, the diagonal parity S is:

$$S = \left( \bigoplus_{x=0}^{n-2} c_{x,0} \right) \oplus \left( \bigoplus_{x=0}^{n-2} c_{x,1} \right)$$

where S actually is the XOR of the symbols in parity columns. Define the horizontal and diagonal syndromes are:

$$S_u^0 = \bigoplus_{\substack{x=0 \\ x \neq i,j}}^{n} d_{u,x}$$

and $$S_u^1 S \oplus a_{u,n+1} \oplus \left( \bigoplus_{\substack{x=0 \\ x \neq i,j}}^{n-1} a_{u-x,x} \right)$$

where $0 \leq u \leq n-1$. Then, the symbols in columns i and j can be retrieved through the following steps:

i) Initialization:
Set $s \leftarrow -(j-i)-1$, and $d_{n-1,x} \leftarrow 0$ for $0 \leq x \leq m-1$
ii) Calculate the symbol:
Let $d_{s,j} \leftarrow S_{j+s}^1 \oplus d_{s+(j-i),i}$, and $d_{s,i} \leftarrow S_s^0 \oplus d_{s,j}$
iii) Execute iteratively:
Set $s \leftarrow s-(j-i)$,
if $s=n-1$ then stop,
else go to step ii).

Redundant array of independent disks version 6 (RAID-6) based on the XOR operations outperforms other RAID systems thanks to the row diagonal parity (RDP) coding that has faster decoding procedure than others. However, when the RDP code scheme was designed, the advantages of parallel processes or multi-core processors have not been considered. It cannot take full advantage of the hardware implementation of XOR codes. This patent application presents an optimal parallel decoding scheme called extended row diagonal parity (EDP), an extension of the double-erasure correcting RDP code. The EDP coding can improve decoding velocity of RDP scheme by 50% without any change for the current RDP configuration for storage.

Figure 7:
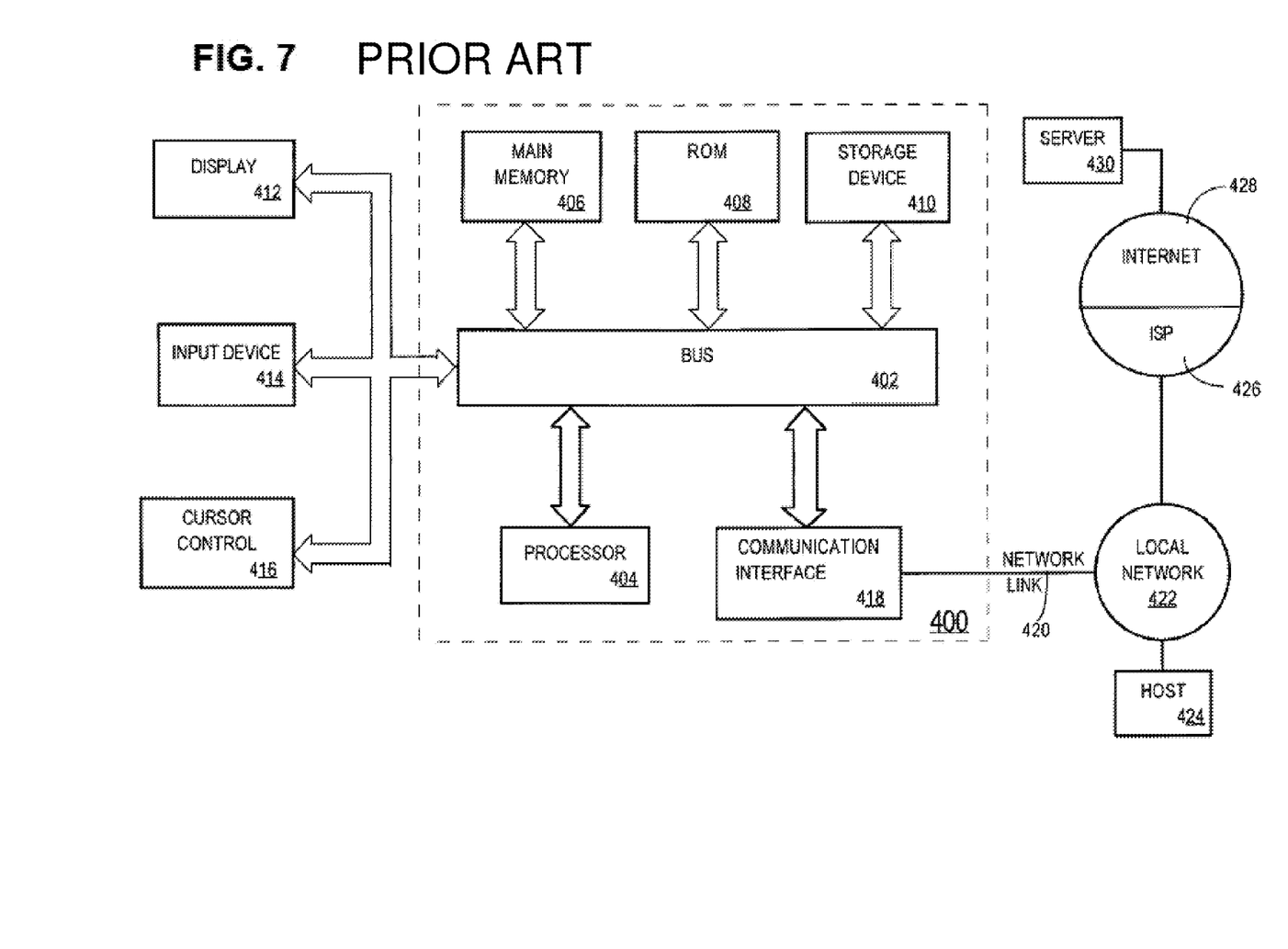
FIG. 7 illustrates a computer system that could be used to implement the invention.

FIG. 7 (see U.S. Pat. No. 7,702,660, expressly incorporated herein by reference), shows a block diagram that illustrates a computer system 400 upon which an embodiment of the invention may be implemented. Computer system 400 includes a bus 402 or other communication mechanism for communicating information, and a processor 404 coupled with bus 402 for processing information. Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Computer system 400 further includes a read only memory (ROM) 408 or other static storage device coupled to bus 402 for storing static information and instructions for processor 404. A storage device 410, such as a magnetic disk or optical disk, is provided and coupled to bus 402 for storing information and instructions.

Computer system 400 may be coupled via bus 402 to a display 412, such as an liquid crystal display (LCD), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane. Of course, other user input devices may be employed.

According to one embodiment of the invention, various techniques are performed by computer system 400 in response to processor 404 executing one or more sequences of one or more instructions contained in main memory 406. Such instructions may be read into main memory 406 from another machine-readable medium, such as storage device 410. Execution of the sequences of instructions contained in main memory 406 causes processor 404 to perform the process steps described herein. In alternative embodiments, hard-wired circuitry may be used in place of or in combination with software instructions to implement the invention. Thus, embodiments of the invention are not limited to any specific combination of hardware circuitry and software. The processor may be a single core processor, multiple traditional core processor, single-instruction multiple data (SIMD) processor, CPLD, ASIC, or other type of processor.

The term "machine-readable medium" as used herein refers to any medium that participates in providing data that causes a machine to operation in a specific fashion. In an embodiment implemented using computer system 400, various machine-readable media are involved, for example, in providing instructions to processor 404 for execution. Such a medium may take many forms, including but not limited to, non-volatile media, volatile media, and transmission media. Non-volatile media includes, for example, optical or magnetic disks, such as storage device 410. Volatile media includes dynamic memory, such as main memory 406. Transmission media includes coaxial cables, copper wire and fiber optics, including the wires that comprise bus 402. Transmission media can also take the form of acoustic or light waves, such as those generated during radio-wave and infra-red data communications. The media may be tangible to enable the instructions carried by the media to be detected by a physical mechanism that reads the instructions into a machine.

Common forms of machine-readable media include, for example, flash drive, hard disk, or any other magnetic medium, a CD-ROM, DVD-ROM, any other optical medium, a RAM, a PROM, and EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 404 for execution. For example, the instructions may initially be carried on a magnetic disk of a remote computer. The remote computer can load the instructions into its dynamic memory and send the instructions over a copper wire or cable line using a modulator/demodulator (modem). A modem local to computer system 400 can receive the data on the wire or cable and use an infra-red or radio frequency transmitter to convert the data to an electromagnetic signal. An electromagnetic signal detector can receive the data carried in the signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are exemplary forms of carrier waves transporting the information.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

SUMMARY OF THE INVENTION

It is an object of the invention to provide a method of recovering up to two lost columns in a data matrix comprising n rows numbered 0 through n−1 and two parity columns, comprising: selecting a column i and a column j to recover; calculating, as an accelerator, an implied (or inherent) but missing chain parity from the available data columns and parity columns; setting a starting point k=n−1 for a chain i and a starting point k for a chain j; and repeating (n−1)/2 times: setting k=k−(j−i) as the starting point in the column i; setting k=k−(n−(j−i)) as the starting point in the column j; calculating a recovered value for the point (k, j) on the basis of at least a chain with a slope of 1 and the accelerator; and calculating a recovered value for the point (n−1−(j−i), i) on the basis of a chain with a slope of 0 and the accelerator; and saving the recovered value in a recovered data matrix.

Optionally, the accelerator is calculated according to the equation $$c_{n-1,1} = \bigoplus_{i=0}^{n-2} c_{i,1},$$

where c represents an accelerator value corresponding to a cell.

Optionally, the parity value is calculated using the XOR function.

Optionally, the column i and the column j are failed prior to recovery.

It is also an object of the invention to provide a method of recovering up to two lost data columns in a data matrix comprising at least four data columns and two parity columns, comprising: calculating as an accelerator row a missing chain parity based on available data columns and the two parity columns; defining a recoverable data cell in each of the two columns to be recovered; iteratively calculating a value for each recoverable data cell based on the available columns, parity information, previously recovered data cells, and the accelerator row and storing the calculated value in the data matrix; and providing the recovered data matrix.

Optionally, the accelerator row is calculated according to the equation:

$$c_{n-1,1} = \bigoplus_{i=0}^{n-2} c_{i,1},$$

where c represents an accelerator value corresponding to a cell, n represents the number of rows in the matrix, and i represents a row counter.

Optionally, the parity columns are derived using the XOR function.

Other embodiments of the invention involve a processor and a computer readable medium comprising machine instructions configured to implement at least one of the above methods.

DETAILED DESCRIPTION OF THE PREFERRED EMBODIMENT

In modern storage systems, redundant array of independent disks (RAID) techniques are known as the preferable technique to achieve high performance and reliability. RAID systems protect the data against disk failures by constructing an array of hard disks with redundant information. In the common RAID techniques, RAID-6, which can tolerate two failure-disks, has the better balance between storage efficiency and reliability. Erasure-coding technologies can provide both high fault tolerance and high storage efficiency. Thus, this technology has been adopted by the designers of storage systems and has been used in many systems in practice.

However, with the development of the multi-core processor and hardware implementation, the performance of algorithm can be improved drastically if some of operations can be processed parallel. Plank [14] suggested that, in multi-core CPUs, there will be an additional challenge for open source libraries to exploit the opportunities of multiple processors on a board. In addition, attention to the processor/cache interaction will be paramount for high performance. In fact, there will be another concern: Can a new code be designed, or current code modified, specially for parallel processing?

In the current XOR-based RAID-6 schemes, the encoding process can be implemented in parallel since the chains are independent of each other. However, in practice, data symbols are more important than the parity symbols, people always care more about how fast the failed data symbols can be recovered in the decoding scheme, than how fast the parity symbols can be constructed. To date, a few classes of RAID codes have been successfully designed to recover simultaneous double storage node failures, including EVEN-ODD, Row Diagonal Parity (RDP) and Minimal Density RAID-6 codes, etc.

Although X-code is an elegant two-erasure code, it is not a RAID code. It does not fit the RAID-6 specification of having coding devices P and Q, where P is a simple parity device. A recent examination of the performance of the codes for RAID-6 using Classic Reed-Solomon codes and Cauchy Reed-Solomon codes based on Open-Source Erasure Coding Libraries concluded that special purpose RAID-6 codes vastly outperform their general purpose counterparts and RDP performs the best of these by a narrow margin. This leads to the question of whether speedup can be achieved in the parallel decoding process if both the coding slopes have the imaginary symbol.

The current reality is that although these codes, including RDP, can be implemented efficiently due to the simplicity of the XOR operation, they are not considered for the parallel implementation on the multi-processer or hardware. For example, RDP code can start two iterative chains at the beginning, but one of them has to stop quickly when it hits the symbol in the "missing" chain.

The RDP code was initially proposed to address disk failure problem in disk array systems. Data symbols stored on multiple disks form a two dimensional array, in which each disk corresponds to one column of the array. The RDP scheme is based on a simple parity encoding scheme using only XOR operations. Following the general construction for 2-erasure code, each symbol belongs to one row parity set and to one diagonal parity set.

An extended row diagonal parity (EDP) decoding scheme is provided, which can be parallelized. The decoding velocity of EDP code is two-times faster than for an RDP code, without changing any disk configuration for the RDP code. The EDP scheme can be effectively implemented in parallel on multi-processer or reconfigurable hardware devices to improve the decoding throughout.

The encoding procedure for the EDP is, of course, the same as the RDP, since it is the decoding procedure which is enhanced.

Figure 8:
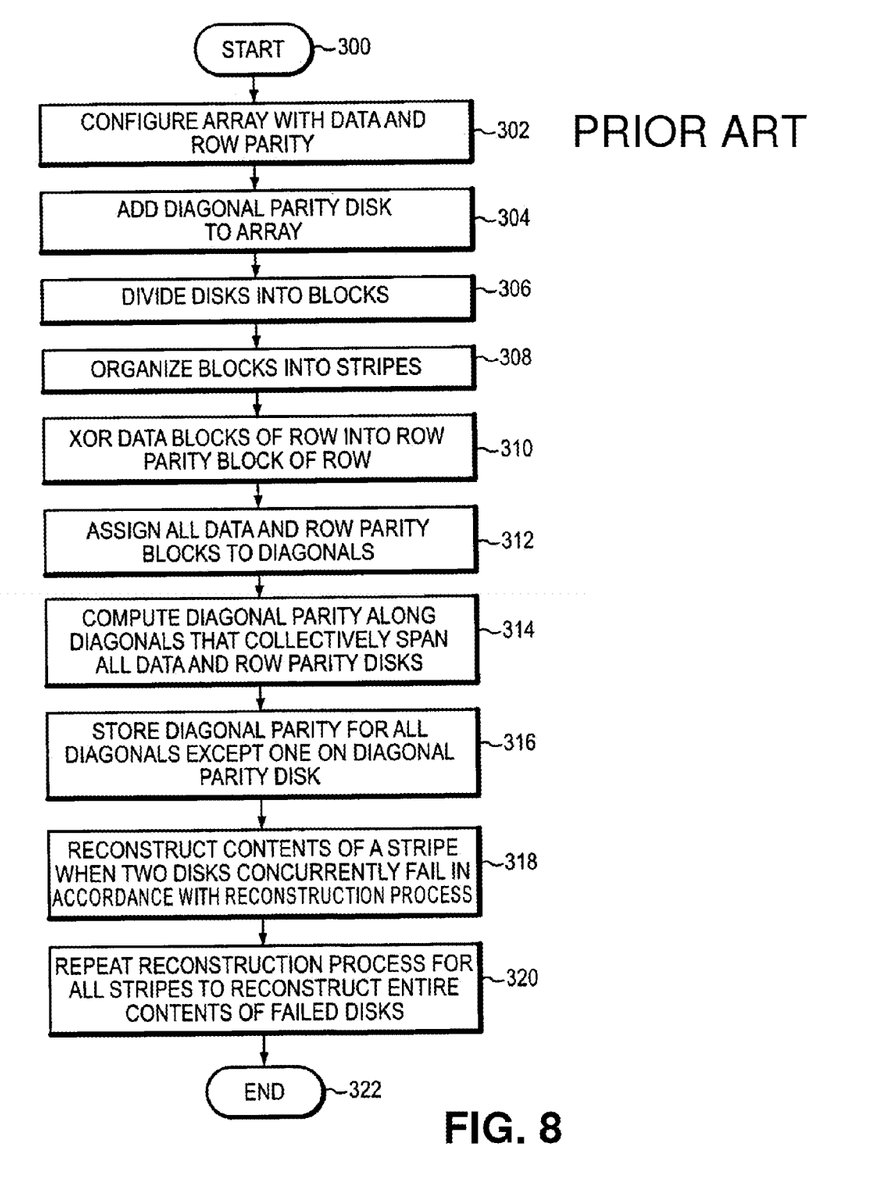
FIG. 8 is a flowchart illustrating the sequence of steps comprising a prior art row diagonal parity (RDP) technique.

FIG. 8, copied from U.S. Pat. No. 7,203,892, is a flowchart illustrating a prior art sequence of steps comprising the RDP technique corresponding to that of the present invention. The sequence starts in Step 300 and proceeds to Step 302 wherein the array is configured with a number of storage devices, such as disks, equal to a prime number p, including a row parity disk. In Step 304, an additional diagonal parity disk is included such that the entire array consists of p+1 disks. As described below, the diagonal parity disk stores diagonal parity that is computed by defining diagonal parity sets that collectively span all the data disks and the row parity disk of the array. The array therefore comprises p−1 data disks, one row parity disk and one diagonal parity disk. In Step 306, the disks are divided into blocks and, in Step 308, the blocks are organized into stripes, wherein each stripe comprises m−2 rows of blocks (with m=p+1). Each disk is preferably divided into stripes of m−2 blocks. In Step 310, each data block of a row is XORed into a row parity block of the row containing the XOR of all data blocks at the same position on each data disk.

All of the data blocks and the row parity blocks are then assigned to diagonals in Step 312. For an array containing p disks, the diagonals are contained within groups of p−1 rows of blocks. There are exactly p diagonals, wherein each diagonal contains one diagonal parity block comprising the XOR of exactly p−1 data and/or row parity blocks. The diagonals wrap around at the edges of the array, with each of the p diagonal sets excluding exactly one disk. Each diagonal must exclude a different disk. Within the set of p−1 rows, every disk block is on exactly one of the p diagonals. Table 1 illustrates an embodiment of an array for p=5 with the diagonals numbered from 0 to 4. The numbers in the table indicate the diagonal parity sets to which each block belongs.

TABLE 1

| 1 | 2 | 3 | 4 | 0 | 1 |
|---|---|---|---|---|---|
| 2 | 3 | 4 | 0 | 1 | 2 |
| 3 | 4 | 0 | 1 | 2 | 3 |
| 4 | 0 | 1 | 2 | 3 | 4 |

It should be noted that the positions of the columns can be permuted, as can the positions of the elements in each column, as long as no two blocks in a row belong to the same diagonal parity set, without changing the property that the array can be reconstructed from any two disk failures. Without loss of generality, it can be assumed that blocks are assigned to diagonal parity sets in a way that is substantially in accord with Table 1. Furthermore, membership of blocks in rows can be permuted.

As noted, the parity for the diagonal parity sets is stored on the diagonal parity disk. In accordance with the invention, the RDP technique does not distinguish between the row parity and data blocks when computing the diagonal parity stored on the diagonal parity disk. In other words, all disks of the original array can be treated equivalently such that the information stored on any one of them can be recovered from the XOR sum of all the other disks in the row parity set. The diagonal parity disk thus stores diagonal parity computed along diagonal parity sets that collectively span all the data disks and the row parity disk of the array (Step 314). It should be noted that the roles of the disks, e.g., data, row parity or diagonal parity disks, can be varied from stripe to stripe, allowing RAID-5 style distributed parity implementations.

However, there is insufficient space on the diagonal parity disk to hold all the parity information for the p diagonals defined on the p−1 rows. In particular there is only sufficient room for p−1 blocks of diagonal parity. Each data disk and the row parity disk contribute, at most, one block to a diagonal and no row contains two blocks, whether data or row parity, that are both members of the same diagonal. Although there are exactly p diagonals, within a stripe there are only p−1 diagonal parity blocks on the diagonal parity disk.

To overcome this, the diagonal parity for one of the diagonal parity sets is not stored on the diagonal parity disk (Step 316). That is, the diagonal parity disk contains parity blocks for each of the diagonals of a stripe except one. The choice of which diagonal parity block not to store is arbitrary. Since that parity is not stored, it is also not computed. Yet even though the parity for one of the diagonals is not stored, the inventive technique provides sufficient parity information to recover from any two concurrent disk failures in the array. That is, the entire contents of a stripe can be reconstructed when any two of its disks are lost in accordance with a reconstruction aspect of the present invention (Step 318). By repeating the reconstruction process for all stripes, the entire contents of the two failed disks may be reconstructed in Step 320. The sequence then ends at Step 322.

Since there is no distinction between the row parity disk and the data disks when assigning disks to diagonals, the distinction between the row parity and data disks can be ignored when dealing with recovery from diagonal parity sets. To illustrate, consider that any two data disks or any one data disk and the row parity disk are lost. A lost block of a parity set can be restored only if all other blocks that compose the parity set are available. An artifact of XOR parity, is that all blocks are mathematically equivalent, whether they originally hold data or parity. For example, consider the parity construction a^b^c=d, wherein "^" represents an XOR operator. XORing both sides with d gives a^b^c^d=0. Therefore, all the data disks and the row parity disk may be treated the same during reconstruction.

In each of these disks, exactly one diagonal is not represented. Accordingly, reconstruction can begin on the other disk that does not contain a member of that diagonal. Since two disks have failed, in most cases, there are two blocks that can be reconstructed immediately from diagonal parity data. This is true unless one of the diagonals that is missing only one block is the diagonal for which no parity is stored. But since at most one disk is missing data for that parity set, there is at least one block that can be reconstructed immediately. Once one or two blocks are reconstructed from diagonal parity, then the other missing block in that or those row(s) can be reconstructed from row parity, as at that point only one block is missing from the row parity sets having blocks reconstructed using diagonal parity (which does not include the diagonal parity blocks). Once those blocks are reconstructed, one or two more blocks can be reconstructed that are on the same diagonal(s) as the row blocks.

Therefore, reconstruction proceeds by a series of diagonal, then horizontal, "moves". Since p is prime, all series of horizontal then diagonal moves "hit" every row of a stripe before hitting the same row twice. Yet there is one diagonal over which no diagonal move is possible because parity is not stored for that diagonal. Without losing generality, the diagonals are numbered from 0 to p−1, and parity is computed for all but diagonal 0. Thus, no diagonal moves are possible along diagonal 0. For disks that are a given distance apart in the array, there is always a fixed sequence of diagonals that can be reconstructed ending with diagonal 0. If the disks are numbered from 0 to p−1, and wrap around among the disks is considered so that disk p−1 (the row parity disk) is adjacent to disk 0, then there are (p−1) sequences to consider. Each sequence corresponds to the reconstruction of any pair of disks separated by that distance. Table 2 illustrates sequences for, e.g., p=13:

TABLE 2

| Disks | 1 apart:  | 1  | 2  | 3  | 4  | 5  | 6  | 7  | 8  | 9  | 10 | 11 | 12 | 0 |
|-------|-----------|----|----|----|----|----|----|----|----|----|----|----|----|---|
| Disks | 2 apart:  | 2  | 4  | 6  | 8  | 10 | 12 | 1  | 3  | 5  | 7  | 9  | 11 | 0 |
| Disks | 3 apart:  | 3  | 6  | 9  | 12 | 2  | 5  | 8  | 11 | 1  | 4  | 7  | 10 | 0 |
| Disks | 4 apart:  | 4  | 8  | 12 | 3  | 7  | 11 | 2  | 6  | 10 | 1  | 5  | 9  | 0 |
| Disks | 5 apart:  | 5  | 10 | 2  | 7  | 12 | 4  | 9  | 1  | 6  | 11 | 3  | 8  | 0 |
| Disks | 6 apart:  | 6  | 12 | 5  | 11 | 4  | 10 | 3  | 9  | 2  | 8  | 1  | 7  | 0 |
| Disks | 7 apart:  | 7  | 1  | 8  | 2  | 9  | 3  | 10 | 4  | 11 | 5  | 12 | 6  | 0 |
| Disks | 8 apart:  | 8  | 3  | 11 | 6  | 1  | 9  | 4  | 12 | 7  | 2  | 10 | 5  | 0 |
| Disks | 9 apart:  | 9  | 5  | 1  | 10 | 6  | 2  | 11 | 7  | 3  | 12 | 8  | 4  | 0 |
| Disks | 10 apart: | 10 | 7  | 4  | 1  | 11 | 8  | 5  | 2  | 12 | 9  | 6  | 3  | 0 |
| Disks | 11 apart: | 11 | 9  | 7  | 5  | 3  | 1  | 12 | 10 | 8  | 6  | 4  | 2  | 0 |
| Disks | 12 apart: | 12 | 11 | 10 | 9  | 8  | 7  | 6  | 5  | 4  | 3  | 2  | 1  | 0 |

Note that the sequence for disks k apart always starts at diagonal k, and continues by incrementing the diagonal by j each time, modulo p, and ends at p, mod p=0. Note also that the first p terms of the sequence for disks k apart is the reverse of the first p terms of the sequence for disks p−k apart.

The starting position on a sequence depends on which pair of disks has failed. When the disks and diagonals are numbered according to the previous description, i.e., the disks are numbered sequentially from 0 to m−1, the rows are numbered sequentially from 0 to m−3 and block i of disk j belongs to diagonal parity set (i+j+1) mod(m−1) in each disk j that has failed, the missing diagonal is always diagonal j. Therefore, for a pair of disks separated by k, the two diagonals for which repair can begin are j and (j+k) mod m−1. Note that these two diagonals are always adjacent in the reconstruction sequence for disks k apart. Reconstruction proceeds in a sequence of diagonals determined by moving to the right from the starting point in the two sequences, for disks k apart starting at symbol (j+k) mod(m−1) and for disks p−k apart, starting at symbol j, where k<p/2. Accordingly, it is always possible to fully reconstruct if any combination of two data disks or one data disk and the row parity disk fails. If the diagonal parity disk and one other disk fail, it is a simple matter to reconstruct the other failed disk, whether it be data or row parity from the stored row parity and then to reconstruct the diagonal parity disk. As a result, the inventive R-D parity technique allows recovery from any two disk failures.

It should be noted that not all data blocks belong to a diagonal for which parity is computed. In fact, diagonal parity is computed for only (p−1)/p of the data and row parity blocks. A single block update is expensive, as row parity must be recalculated for that block as well as diagonal parity for the block. Then, when the row parity for the block is updated, the change must be added into the diagonal parity block for the row parity block as well. However, this can be simplified in systems where a stripe is one "block" wide and is composed of subblocks used only for parity computation. Here, a parity update is computed that is added to the row parity. Portions of the same parity update block are also added directly to portions of the diagonal parity block for the stripe.

Below is the algebraic description of the RDP coding scheme. Let $d_{ij}$ be the information symbol at the i-th row and j-th column. The parity symbols of RDP-code are constructed according to the following encoding rules:

$$c_{i,0} = \bigoplus_{t=0}^{n-2} d_{i,t} \quad (1)$$

and $$c_{i,1} = \left(\bigoplus_{t=0}^{n-2} d_{i-t,t}\right) \oplus c_{i+1,0}, \quad (2)$$

Where i=0, 1, . . . , n−2.

Figure 1:
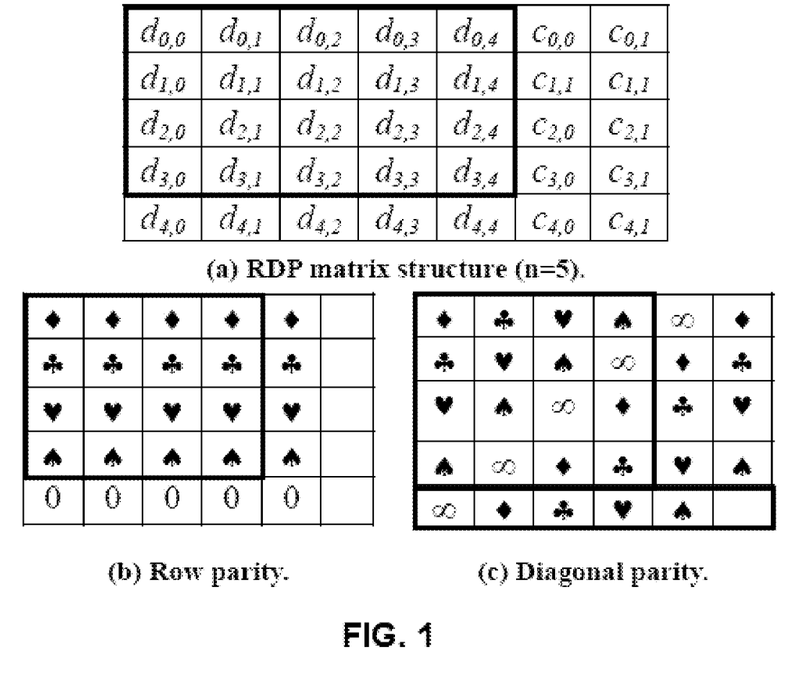
FIG. 1 is an illustration of the row diagonal parity (RDP) encoding procedure, according to an embodiment of the invention.

FIG. 1 illustrates the encoding procedure. The two parity columns are the parity along diagonals of slopes 0 and 1, respectively and the $2^{nd}$ column is dependent on the $1^{st}$ column. The last row is the imaginary row, which does not exist but is very useful to find the starting point in the decoding procedure.

Although there are n diagonals, only n−1 chains, XOR results are stored in the $c_1$ column. The diagonal chain that is not stored is referred as the "missing" diagonal represented by '∞'. There is no restriction on which diagonal is selected to store parity symbols. In default, diagonal n−1 is selected as the missing diagonal. Since the parity symbol of the missing diagonal is not stored, it is not necessary to compute it.

In FIG. 1, if two data columns are failed, they need to be reconstructed from the remaining data symbols and parity symbols. The iterative process does not start from row parity because there are two members are lost in the every row parity set.

Figure 2:
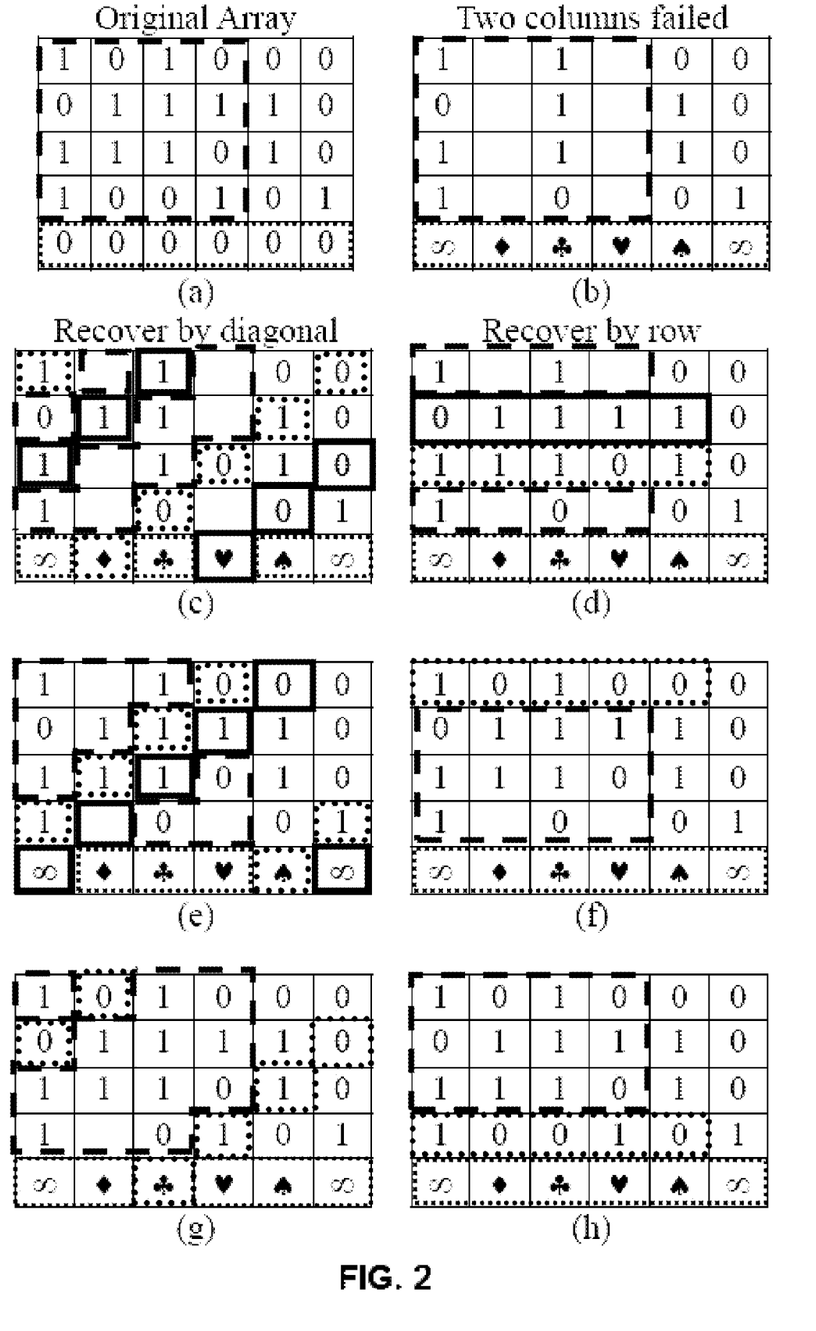
FIG. 2 is an illustration of the row diagonal parity (RDP) decoding procedure, according to an embodiment of the invention.

Assume that symbol disks 1 and 3 have failed in the array shown in FIGS. 2A-2H. Consider the decoding procedure as illustrated by the encoding example shown in FIG. 2A, and the result is shown in FIG. 2B. The decoding procedure is presented from FIG. 2C to FIG. 2H.

As shown in FIG. 2B, the symbol ♦ (diamond) and symbol ♥ (heart) lie on the imaginary row, which implies that there is only one symbol missing in each of the diagonal parity chain ♦ (diamond) and chain ♥ (heart). This allows the two missing symbols (2, 3) and (1, 1) to be recovered immediately as shown in FIG. 2C. Then, the row parity is used to recover two more missing symbols (2, 1) and (1, 3) in the two rows where the two diagonal symbols have been recovered as shown in FIG. 2D.

When the decoding process continues, the diagonal '∞' prevents the information symbol (1, 3) to be recovered. Because it is on the 'missing' chain and no parity symbol has been computed or stored in the encoding procedure. However, the procedure can still continue along the diagonal ♠ (spade). Then the data symbol (0, 3) in diagonal ♠ (spade) in symbol disk 3 can be recovered as shown by FIG. 2E. The next step is to reconstruct the symbol (0, 1) using row parity as shown in FIG. 2F and then the symbol (3, 3) in diagonal ♣ (leaf) in disk 3 as shown in FIG. 2G. Finally the symbol (3, 1) is recovered using row parity as shown in FIG. 2H.

Figure 3:
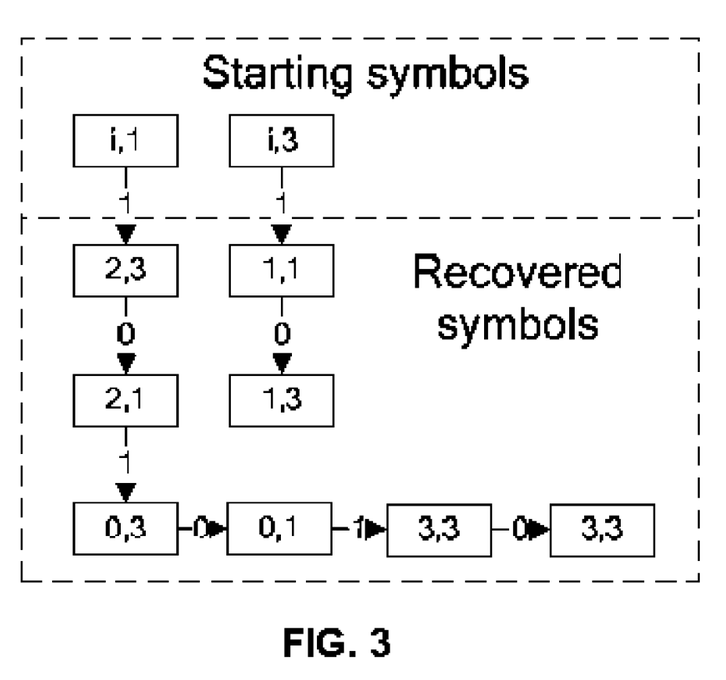
FIG. 3 is a flowchart of the row diagonal parity (RDP) decoding procedure, according to an embodiment of the invention.

FIG. 3 shows the decoding procedure chains of the example in FIGS. 2A-2H. Six iterations are needed to recover all the failed symbols. It is observed that it does not compute parity for the missing chains, and it is not required to complete the reconstruction of all the missing blocks.

RDP code constructs a (n−1) row by (n+1) column array. FIG. 3 shows that six steps are needed to recover the failed symbols. Actually, if the starting point is on the missing chain, i.e. the first column shown in FIG. 2B, it will take eight iterative steps to recover the failed symbols. In general, the number of iterative steps varies from (n−1) to 2(n−1), depending on when the symbols on the missing chain will be hit. The more the steps are taken, the slower the decoding procedure is and the lower the throughput is.

It is feasible to optimize the decoding procedure such that it takes the least number of steps (n−1 steps). In one embodiment, a decoding scheme is provided that after setup, achieves the optimal decoding procedure. Essentially, the EDP scheme is an extension of RDP code by adding one more "virtual accelerator" symbol in the decoding procedure to solve the problem introduced by the "missing" chain. It is called "virtual", since the accelerator is generated on the fly during the decoding procedure. It is not stored in any disk prior to the decoding.

Extended Row Diagonal Parity (EDP) Decoding Scheme

The EDP decoder can be described as a combination of an accelerator and a RDP decoder. An advantage of the EDP decoder is that the current RDP scheme can be updated to the new EDP decoding scheme smoothly, without any substantial change. Thus, a transition from RDP to EDP can be seamless to end users of a data storage system.

It is trivial to recover a single column using the RDP technique described in U.S. Pat. No. 7,203,892, expressly incorporated herein by reference. Therefore, this section describes how to recover two failed columns under variant scenarios.

A. i=n and j=n+1

Both the parity columns are failed. This is identical to the encoding case described above.

B. i<n and j=n+1

The last slope parity column is failed. The symbols can be recovered as follows:

(1) reconstruct the i-th column according to the row parity; and (2) reconstruct the j-th column according to the slope parity.

C. $0 \leq i \leq j < n$

This is the most common case. It is infeasible to recover the failure symbols separately.

An embodiment can be described in follow two steps.

Step 0 involves calculating the accelerator using the function:

$$c_{n-1,1} = \bigoplus_{i=0}^{n-2} c_{i,1} \quad (4)$$

It should be noted that $c_{n-1,1}$ is the parity of the missing chain.

Then, Step 1 is to run the RDP decoding procedure described above.

Since the jump condition in the algorithm can influence the throughput of the decoding, an alternative embodiment involves a modified algorithm based on the accelerator. This algorithm allows two iterative chains to "encounter," meaning reach the same cell, after each chain has covered half of the symbols. Also, it only takes (n−2)/2 steps to recover the failed symbols. This is the optimal decoding process because there are only two traverse chains.

According to one embodiment, the two iterative chains can only encounter in the middle, with either of them traversing half of the failed symbols. Therefore, it is not necessary to consider the missing chain in each step, which can reduce the CPI. The new EDP decoding algorithm can be described as follows:

Decoding Algorithm:
Step 0: Calculating the accelerator:

$$c_{n-1,1} = \bigoplus_{i=0}^{n-2} c_{i,1}$$

Step 1: Set k=n−1, and the starting point with (k, i) and (k, j); for each chain, counter$_{chain}$=0;
Step 2: Set k=k−(j−i) for starting point from $i^{th}$, and k=k−(n−(j−i)) for starting point from $j^{th}$ column;
Step 3: Using chain with slope 1, recovering the next point (k, j);
Step 4: Using slope 0 to recover the point (n−1−(j−i), i);
Step 5: counter$_{chain}$++;
Step 6: If counter$_{chain}$=(n−1)/2
  Exit Chain;
Else
  Go to Step 2.

An advantage of this algorithm is that each chain may be processed independently without sharing any data, which is preferable for facilitating parallel processing in a multi-core or hardware implementation of an embodiment.

Figure 4:
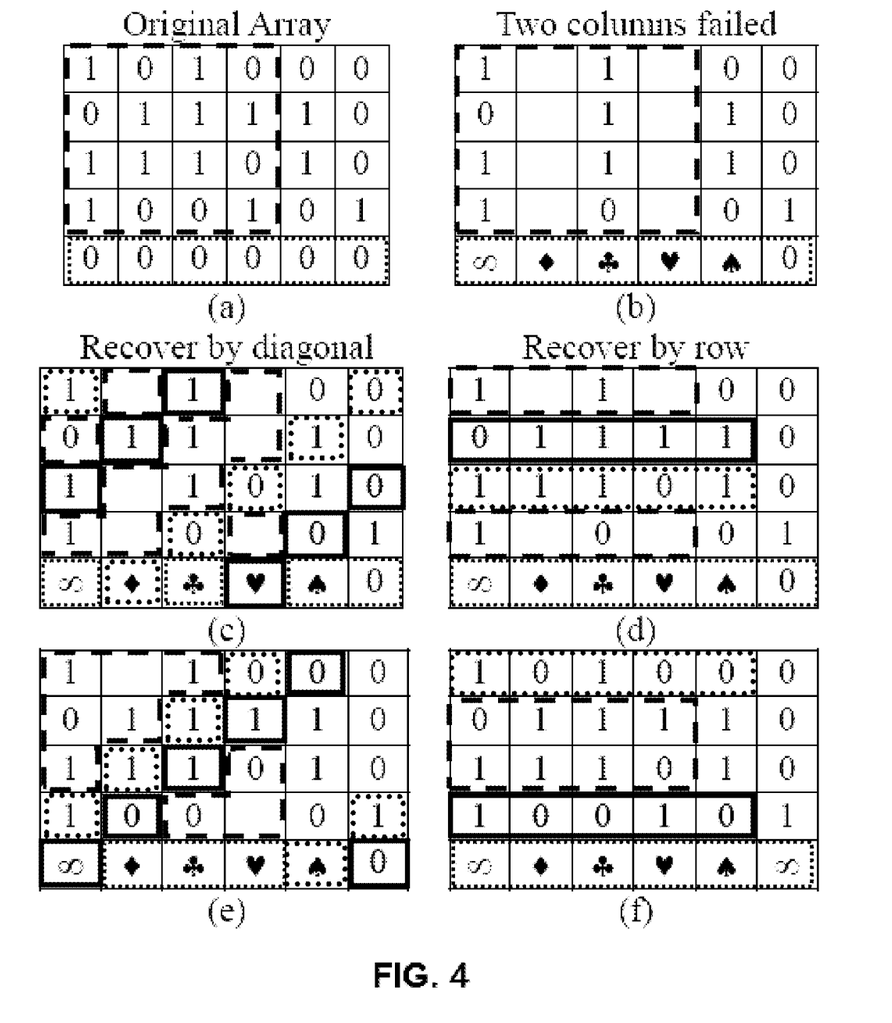
FIG. 4 is an illustration of the extended row diagonal parity (EDP) decoding procedure, according to an embodiment of the invention.

FIG. 4A presents an example of the encoding algorithm. Symbol disks 1 and 3 have failed, as shown in FIG. 4B. The decoding procedure is illustrated by FIGS. 4C through 4F.

In order to recover those lost data symbols, the method starts from the remaining symbol and parity disks. The EDP scheme does not start the iterative process by row parity, since in each row parity set, there are two members that are lost.

In FIG. 4B, the symbols ♦ (diamond) and ♥ (heart) lie in the imaginary row, which implies that in each of the diagonal parity chains ♦ (diamond) and ♥ (heart), there is only one symbol missing. Therefore, the two missing symbols (2, 3) and (1, 1) may be reconstructed immediately as shown in FIG. 4C. Then, the row parity can be used to recover two more missing symbols (2, 1) and (1, 3) in the two rows where the two diagonal symbols have been recovered as shown by FIG. 4D.

Figure 5:
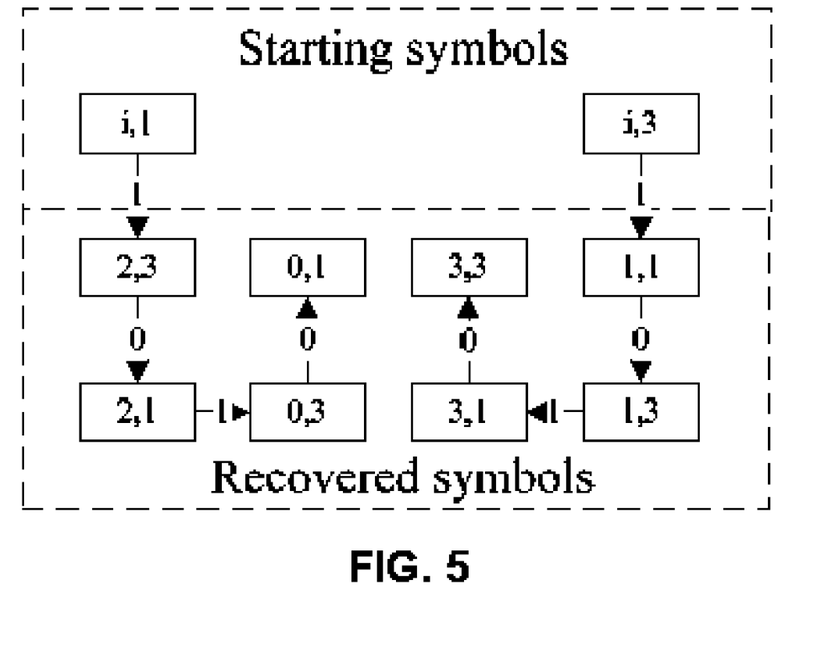
FIG. 5 is a flowchart of an extended row diagonal parity (EDP) decoding procedure, according to an embodiment of the invention.

The iterative decoding process continues until the two chains encounter in the middle, and each of them traverses half of the failed symbols. A state transition diagram of this process is shown in FIG. 5.

Figure 9:
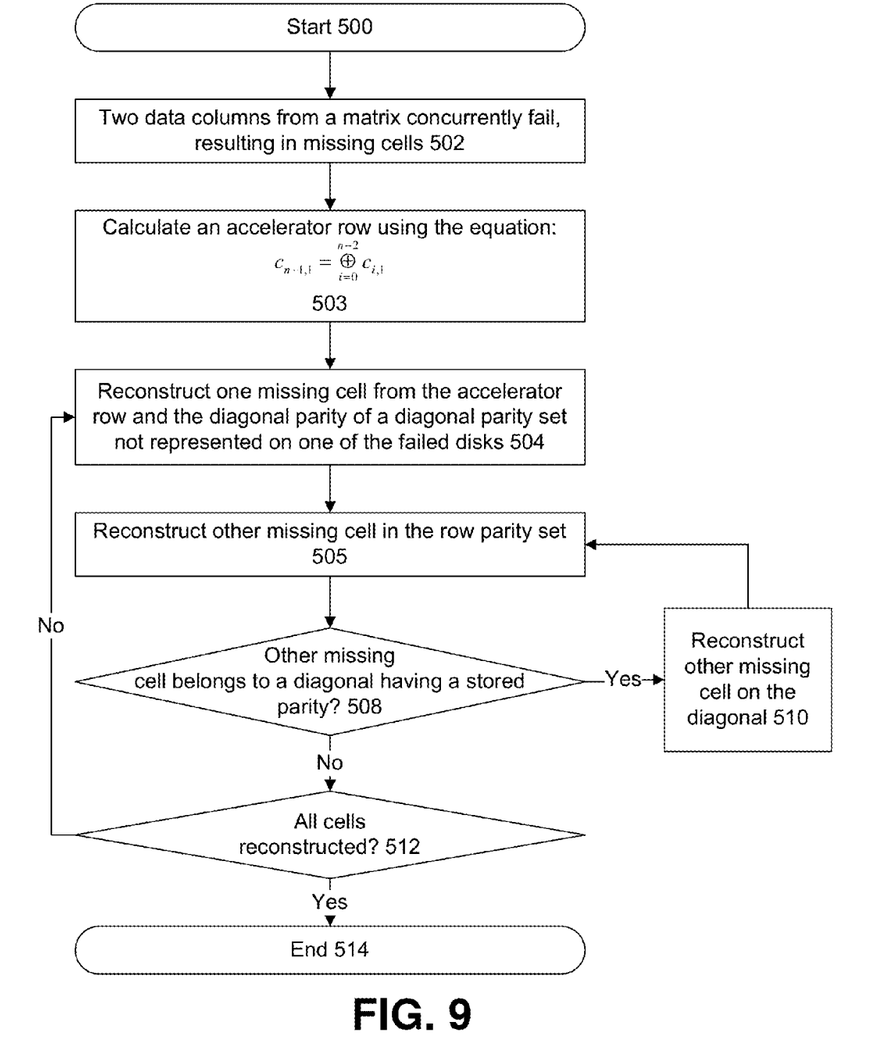
FIG. 9 is a flowchart illustrating the sequence of steps involved in a reconstruction process of the novel extended row diagonal parity (EDP) technique, according to an embodiment of the invention.

FIG. 9 shows a flowchart illustrating the sequence of steps involved in a recovery (reconstruction process) aspect of the extended row diagonal parity technique. The sequence starts at Step 500 and proceeds to Step 502, where it is assumed that two data columns (or one data column and the row parity column) from the matrix 400 are concurrently lost due to failure. As with any combination of two failed data columns, row parity cannot be immediately used to reconstruct the lost data; only diagonal parity can be used. Given the structure and organization of the matrix (i.e., the stripe length and stripe depth are not equal) each diagonal does not include (misses) a cell from one column. Therefore, when the two data columns are lost, two diagonals have lost only one member. In other words, two columns are lost and each of those columns is not a member of one diagonal.

In step 503, an accelerator row is calculated using the equation:

$$c_{n-1,1} = \bigoplus_{i=0}^{n-2} c_{i,1}$$

A diagonal parity cell is stored on the DP column for all but one diagonal; therefore, in Step 504, reconstruction of at least one, and usually two, of the missing cells is initiated using diagonal parity and the accelerator row.

Once a missing cell is reconstructed, reconstruction of a row may be completed by reconstructing the other missing cell on that row using row parity (Step 506). When that other cell is reconstructed, a determination is made in Step 508 as to whether the cell belongs to a diagonal for which there is stored parity. If the cell belongs to a diagonal for which there is parity, the other missing cell on that diagonal can be reconstructed from the other column that is on that diagonal using diagonal parity (Step 510). That is, for all but the missing diagonal, once one cell on the diagonal is reconstructed, the other can be reconstructed. The sequence then returns to Step 506 where the other missing cell in that row parity set is reconstructed. However, if the cell belongs to a diagonal for which there is no parity (i.e., the missing diagonal), then a determination is made in Step 512 as to whether all cells have been reconstructed. If not, the sequence returns to Step 504 where the pattern of first reconstructing based on diagonal parity, then on row parity, continues until the last data cell used in computation of the missing diagonal parity set is reached. Once all cells have been reconstructed, the sequence ends at Step 514. The missing diagonal parity set always terminates the chain of reconstruction.

An extended row diagonal parity (EDP) system and method, a new decoding system and method, are therefore, provided, that is an optimal parallelizable efficient double disk failure recovering algorithm. The EDP system and method is an extension of the RDP code, and requires only n−1 iterative recovery steps in its decoding operations. In comparison with RDP code, the EDP scheme can significantly reduce the data recovery time thanks to the two optimal parallel iterative chains. The advantage of the EDP scheme is that it can be used in the current RDP systems smoothly without significant configuration change.

The EDP algorithm is more suitable for parallel implementation than RDP, since each thread can cover exactly the same amount of failed nodes with the same speed. Along with the simplicity and flexibility, this property makes the EDP scheme an ideal candidate for parallel implementation. Detailed analysis shows that the EDP system and method has a faster decoding process among the existing two iterative recovery chain parity codes. Hence, the EDP system and method is very suitable for achieving high availability in practical data storage systems.

In this description, several preferred embodiments were discussed. Persons skilled in the art will, undoubtedly, have other ideas as to how the systems and methods described herein may be used. It is understood that this broad invention is not limited to the embodiments discussed herein. Rather, the invention is limited only by the following claims.

REFERENCES

Expressly Incorporated Herein by Reference

[1] M. Blaum, J. Brady, J. Bruck, and J. Menon. "EVENODD: An Efficient Scheme for Tolerating Double Disk Failures in RAID Architectures," IEEE Transactions on Computers (44:2), 1995, pp. 192-202.
[2] M. Blaum, P. Farrell, and H. van Tilborg, "Array Codes," Handbook of Coding Theory, V. S. Pless and W. C. Huffman, eds., Elsevier Science Publishers B. V., 1998.
[3] P. Corbett, B. English, A. Goel, T. Grcanac, S. Kleiman, J. Leong and S. Sankar, "Row-Diagonal Parity for Double Disk Failure Correction", Proc. of USENIX FAST 2004, March 31 to April 2, San Francisco, Calif., USA.
[4] C. Huang and L. Xu. "STAR An Efficient Coding Scheme for Correcting Triple Storage Node Failures," IEEE Transactions on Computers (57), 2008, pp. 889-901.
[5] J. Kubiatowicz, D. Bindel, Y. Chen, S. Czerwinski, P. Eaton, D. Geels, R. Gummadi, S. Rhea, H. Weatherspoon, W. Weimer, C. Wells and B. Zhao, "Ocean Store: An Architecture for Global-Scale Persistent Storage", Proc. of the Ninth international Conference on Architectural Support for Programming Languages and Operating Systems, November 2000.
[6] F. J. MacWilliams and N. J. A. Sloane, "The Theory of Error Correcting Codes", Amsterdam: North-Holland, 1977.
[7] R. Muntz and J. Lui, "Performance analysis of disk arrays under failure." Proceedings of the 16th VLDB Conference, pg. 162-173, Brisbane, June 1990.
[8] J. S. Plank, "A Tutorial on Reed-Solomon Coding for Fault-Tolerance in RAID-like Systems" Software: Practice and Experience, vol. 27, no. 9, pp. 995-1012, January 1999.
[9] J. S. Plank, "The RAID-6 Liberation Codes" FAST '08: 6th USENIX Conference on File and Storage Technologies, pp. 97-110, San Jose, Calif., February, 2008.
[10] J. S. Plank, J. Luo, C. D. Schuman, L. Xu, and Z. Wilcox-O'Hearn "A Performance Evaluation and Examination of Open-Source Erasure Coding Library for Storage," FAST '09: 7th USENIX Conference on File and Storage Technologies, San Francisco, Calif., February, 2009.
[11] M. Rabin, "Efficient Dispersal of Information for Security, Load Balancing and Fault Tolerance", J. ACM, 32(4), 335-348, April 1989.
[12] I. S. Reed and G. Solomon, "Polynomial Codes over Certain Finite Fields", J. SIAM, 8(10), 300-304, 1960.
[13] L. Xu and J. Bruck. "X-Code: MDS Array Codes with Optimal Encoding," IEEE Trans. on Information Theory (45), 1999, pp. 272-276.
[14] J. S. Plank, J. Luo, C. D. Schuman, L. Xu, and Z. Wilcox-O'Hearn "A Performance Evaluation and Examination of Open-Source Erasure Coding Library for Storage," FAST '09: 7th USENIX Conference on File and Storage Technologies, San Francisco, Calif., February, 2009

The invention claimed is:

1. A method of recovering a plurality of data columns in a data matrix comprising n rows numbered 0 through n−1, and a pair of parity columns, comprising:
selecting a column i and a column j to recover;
calculating, as an accelerator, an implied but missing chain parity from the available data columns and parity columns;
setting a starting point k=n−1 for a chain i and a starting point k for a chain j; and
repeating (n−1)/2 times:
setting k=k−(j−i) as the starting point in the column i;
setting k=k−(n−(j−i)) as the starting point in the column j;
calculating a recovered value for the point (k, j) on the basis of at least a chain with a slope of 1 and the accelerator;
calculating a recovered value for the point (n−1−(j−i), i) on the basis of a chain with a slope of 0 and the accelerator; and
storing the recovered value in the data matrix.

2. The method of claim 1, wherein the accelerator is calculated according to the equation $$c_{n-1,1} = \bigoplus_{i=0}^{n-2} c_{i,1},$$

where c represents an accelerator value corresponding to a cell.

3. The method of claim 1, wherein the parity value is calculated using the XOR function.

4. The method of claim 1, wherein the column i and the column j are failed prior to recovery.

5. A non-transitory computer readable medium comprising machine instructions for controlling a programmable processor to recover two data columns in a data matrix comprising at least four data columns and at least two parity columns, comprising instructions for:
calculating as an accelerator row a missing chain parity based on available data columns and the at least two parity columns;
defining a recoverable data cell in each of the two columns to be recovered;
iteratively calculating a value for each recoverable data cell based on the available columns, parity information, previously recovered data cells, and the accelerator row and storing the calculated value in the data matrix; and
providing the recovered data matrix.

6. The medium of claim 5, wherein the instructions for calculating the accelerator row comprise applying the equation $$c_{n-1,1} = \bigoplus_{i=0}^{n-2} c_{i,1},$$

where c represents an accelerator value corresponding to a cell, n represents the number of rows in the matrix, and i represents a row counter.

7. The medium of claim 5, wherein the parity columns are derived using the XOR function.

8. The medium according to claim 5, wherein said iteratively calculating comprises:
repeating, until sufficient data is recovered:
setting a data cell in each lost column in a different row which is recoverable based on the available data column, parity columns, and the accelerator;
calculating a recovered value for a first recoverable data cell on the basis of at least a chain with a slope of 1 and the accelerator;
calculating a recovered value for a second recoverable data cell on the basis of a chain with a slope of 0 and the accelerator; and
saving the recovered values in the data matrix.

9. The medium of claim 8, wherein the accelerator is calculated according to the equation $$c_{n-1,1} = \bigoplus_{i=0}^{n-2} c_{i,1},$$

where c represents an accelerator value corresponding to a cell, n is the number of rows numbered 0 through n−1, and i identifier of a column to recover.

10. The medium of claim 8, wherein the parity value is calculated using the XOR function.

11. The medium of claim 8, wherein the column i and the column j are failed prior to recovery.

12. A method of recovering at least two data columns in a data matrix comprising at least four data columns and at least two parity columns, comprising:
calculating as an accelerator row, a missing chain parity, based on available data columns and the at least two parity columns;
defining a recoverable data cell in each of the at least two columns to be recovered;
iteratively calculating a value for each recoverable data cell based on the available columns, parity information, previously recovered data cells, and the accelerator row and storing the calculated value in the data matrix; and
providing the recovered data matrix.

13. The method of claim 12, wherein the accelerator row is calculated according to the equation $$c_{n-1,1} = \bigoplus_{i=0}^{n-2} c_{i,1},$$

where c represents an accelerator value corresponding to a cell, n represents the number of rows in the matrix, and i represents a row counter.

14. The method of claim 12, wherein the parity columns are derived using the XOR function.

15. A processor configured to recover at least two data columns in a data matrix comprising at least four data columns and at least two parity columns, comprising:
a memory configured to store a calculated accelerator row representing an absent chain parity, based on available data columns and the at least two parity columns;
a processing unit configured to define a recoverable data cell in each of the at least two columns to be recovered, and to iteratively calculate a value for each recoverable data cell based on the then available columns, parity information, previously recovered data cells, and the accelerator row; and
a memory configured to store the calculated value representing a portion of the recovered data matrix.

16. The processor of claim 15, wherein the instructions for calculating the accelerator row comprise applying the equation $$c_{n-1,1} = \bigoplus_{i=0}^{n-2} c_{i,1},$$

where c represents an accelerator value corresponding to a cell, n represents the number of rows in the matrix, and i represents a row counter.

17. The processor of claim 15, wherein the processing unit is configured to employ the at least two parity columns which are derived using the XOR function.

18. The processor of claim 15, wherein the missing chain parity is calculated in a non-iterative process.

* * * * *